US012176453B2

(12) United States Patent
Mazzillo et al.

(10) Patent No.: US 12,176,453 B2
(45) Date of Patent: Dec. 24, 2024

(54) LIGHT DETECTION WITH SEMICONDUCTOR PHOTODIODES

(71) Applicant: OSRAM Opto Semiconductors GmbH, Regensburg (DE)

(72) Inventors: Massimo Cataldo Mazzillo, Hamburg (DE); Tim Boescke, Regensburg (DE); Wolfgang Zinkl, Tegernheim (DE)

(73) Assignee: OSRAM 0PTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 18/528,920

(22) Filed: Dec. 5, 2023

(65) Prior Publication Data

US 2024/0105876 A1    Mar. 28, 2024

Related U.S. Application Data

(63) Continuation of application No. 17/790,523, filed as application No. PCT/EP2021/050236 on Jan. 8, 2021, now Pat. No. 11,888,078.

(30) Foreign Application Priority Data

Jan. 9, 2020   (DE) ..................... 10 2020 200 189.8

(51) Int. Cl.
*H01L 31/107*    (2006.01)
*H01L 31/109*    (2006.01)
*H01L 31/118*    (2006.01)

(52) U.S. Cl.
CPC ........ *H01L 31/1075* (2013.01); *H01L 31/109* (2013.01); *H01L 31/1185* (2013.01)

(58) Field of Classification Search
CPC ............... H01L 31/1075; H01L 31/109; H01L 31/1185; H01L 31/107
See application file for complete search history.

(56) References Cited

U.S. PATENT DOCUMENTS

| | | | |
|---|---|---|---|
| 2008/0231339 A1* | 9/2008 | Deschamps | H03K 17/28 327/326 |
| 2009/0066897 A1* | 3/2009 | Katoh | G02F 1/13306 349/116 |
| 2010/0060562 A1* | 3/2010 | Hadwen | H01L 31/02164 250/208.2 |
| 2010/0294838 A1* | 11/2010 | Jolivet | G06K 7/10851 235/455 |
| 2016/0211402 A1 | 7/2016 | Joo et al. | |

(Continued)

OTHER PUBLICATIONS

German office action issued for the corresponding German patent application No. 112021000488.3, dated Jul. 23, 2024, 8 pages (for informational purposes only).

*Primary Examiner* — Sitaramarao S Yechuri
(74) *Attorney, Agent, or Firm* — VIERING, JENTSCHURA & PARTNER mbB

(57) ABSTRACT

An integrated photodetecting optoelectronic semiconductor component for detecting light bursts in a light signal received by the component includes a silicon photomultiplier for: measuring the intensity of the light signal received by the component, and outputting a measurement signal that is indicative of the light intensity of the received light signal. The component is characterised by a comparator circuit: having a first input section, a second input section and an output section, and operatively connected to the silicon photomultiplier via its first input section.

13 Claims, 10 Drawing Sheets

FIG. 2

(56) References Cited

U.S. PATENT DOCUMENTS

2019/0146027 A1\* 5/2019 McLaughlin, II . G01R 31/2635
250/214 A
2019/0259900 A1 8/2019 Furuyama
2020/0058821 A1\* 2/2020 Baba .................. H01L 27/1446

\* cited by examiner

LIGHT DETECTION WITH SEMICONDUCTOR PHOTODIODES

This application is a continuation of U.S. patent application Ser. No. 17/790,523, filed on Jul. 1, 2022, which is a US National Stage of International Application PCT/EP2021/050236, filed on Jan. 8, 2021, and claims priority to German Application DE 10 2020 200 189.8, filed on Jan. 9, 2020, the contents of which are hereby incorporated by reference.

TECHNICAL FIELD

A. SiPM Based Light Bursts Detecting Component with Background Light Correction

The present disclosure pertains to an integrated photodetecting optoelectronic semiconductor component for detecting light bursts in a light signal received by the component, the component comprising a silicon photomultiplier for:
measuring the intensity of the light signal received by the component, and
outputting a measurement signal that is indicative of the light intensity of the received light signal

BACKGROUND

The light signal might e.g. be a combination of background light and repetitive light bursts emitted by a special light source, such as a pulsed laser.

Such a component is already known for example from document US 2019/0250703 A1, cf. the digitiser module 500 shown in FIG. 5. The digitiser module 500 is used for eye tracking in a head-mounted display (HMD). Light bursts 115 emitted by an infrared laser are scanned across an eye 130 of a person wearing the HMD. The reflections of the infrared light bursts from the eye 130 are detected by the digitiser module 500. To that effect, the digitiser module 500 includes a silicon photomultiplier (SiPM). In order to filter out undesired ambient or background light 510 and thus improve the signal-to-noise ratio, the digitiser module 500 also includes an optical filter 505. Optical filter 505 filters out light having wavelengths that are different from the wavelength of the infrared laser.

While the provision of an optical filter 505 is helpful in reducing noise, some background light noise will still reach the SiPM of the digitiser module 500. Indeed, the infrared part of the background light is not blocked by the optical filter 505 and can still reach the SiPM. Furthermore, adding a highly selective optical filter 505 to the digitiser module 500 substantially increases its costs.

Light burst detection might also be done using standard known linear photodetectors, which are typically available as integrated and packaged discrete optoelectronic components. The main electronic blocks of such components are a photodiode/PD operating in linear mode, a transimpedance amplifier/TIA, and an analog-to-digital converter/ADC. The photodiode provides an output signal, which is proportional to the intensity of the light signal incident on the photodiode. The output signal is amplified by the TIA and the amplified signal is then digitised by the ADC. The digitised signal corresponds to the photodetector's output signal. By analysing the amplitude of this output signal, one can detect light bursts in the light signal.

However, it turns out that such standard linear photodetectors become comparatively large, complex and power hungry if they are to detect short, high frequency, low intensity light bursts in a light signal. This is because of the stringent requirements such as high bandwidth and high gain that must then be met by the TIA.

SUMMARY

In view of the above, it is thus an object of the present disclosure to provide a light bursts detecting optoelectronic component with an effective and cheap background light noise rejection.

More generally, an object of the present disclosure is to provide a light bursts detecting optoelectronic component that has a simplified, power- and space-saving design, while maintaining high measurement accuracy.

According to the present disclosure, the above objects are achieved with a photodetecting component as initially defined, which is characterised by a comparator circuit:
having a first input section, a second input section and an output section; and
operatively connected to the silicon photomultiplier via its first input section, and
in that the comparator circuit is adapted to:
receive, via its first input section, the measurement signal outputted by the silicon photomultiplier;
receive, via its second input section, a sensitivity threshold value representing the intensity contribution of background light to the received light signal;
suppress the measurement signal during time intervals where the measurement signal is smaller or equal to the sensitivity threshold value, and
output, as a light bursts signal indicative of the light bursts detected in the light signal, the intermittently suppressed measurement signal.

Thanks to the comparator circuit, background light present in the light signal received by the component can be removed electronically. This maximises the signal-to-noise ratio of the light bursts signal delivered by the component. On top of this, a comparator circuit is easy to implement as a part of the component's integrated circuit and thus cheaper than an optical filter.

Also, by using a silicon photomultiplier instead of a linear photodiode as an optical transducer one can dispense with the power-hungry and complex transimpedance amplifier. This is because of the intrinsic large gain provided by the silicon photomultiplier.

In one embodiment, the photodetecting component may further comprise a calibration circuit for adjusting the photodetecting component's sensitivity to the current background light conditions, the calibration circuit being configured for adapting the sensitivity threshold value at the second input section of the comparator circuit as a function of the intensity of the background light present in the received light signal.

In one embodiment, the calibration circuit may have a calibration trigger input section for receiving a calibration triggering signal, and the calibration circuit may be adapted to:
a) receive, via its input section, a calibration triggering signal;
b) upon receipt of a calibration triggering signal, set the value at the second input section of the comparator circuit to a minimum calibration threshold value;
c) obtain the output signal at the output section of the comparator circuit; and
d) set the maximum value of the obtained output signal as the new sensitivity threshold value.

In one embodiment, the photodetecting component may further comprise a counting circuit for:

receiving, as an input, the light bursts signal outputted by the comparator circuit, counting the number of light bursts in the received light bursts signal, and outputting a light bursts rate signal indicative of the number of light bursts per unit time in the light signal received by the component.

In one embodiment, each single photon avalanche diode of the silicon photomultiplier may be passively quenched.

In one embodiment, the photodetecting component may further comprise an active quenching circuit coupled to the silicon photomultiplier.

In one embodiment, each single photon avalanche diode of the silicon photomultiplier may be actively quenched.

In one embodiment, the photodetecting component may further comprise a power supply, such as a DC-DC converter, for the silicon photomultiplier.

In one embodiment, the silicon photomultiplier may be an infrared silicon photomultiplier.

The present disclosure also relates to an eye tracking device comprising a photodetecting component as defined above.

Preferred embodiments of the present disclosure will now be described in detail with reference to FIGS. 1 to 4, wherein:

BRIEF DESCRIPTION OF THE DRAWINGS

Non-limiting embodiments of the present disclosure will now be described in detail with reference to the figures, wherein.

DETAILED DESCRIPTION

Figures 1, 2:
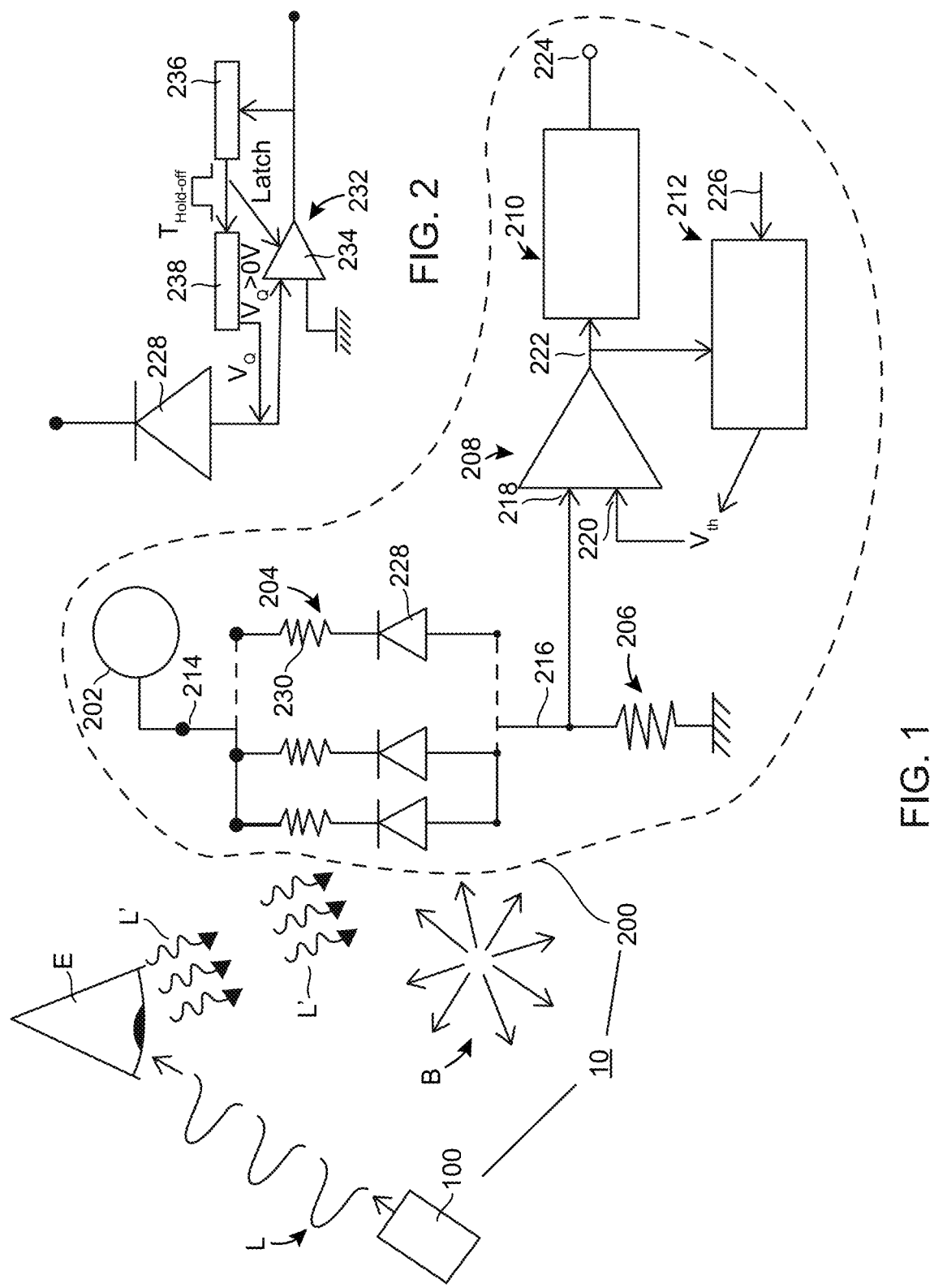
FIG. 1 is a schematic diagram of an eye tracking device of the present disclosure, including a photodetecting component with a silicon photomultiplier and a corresponding readout chain.
FIG. 2 is a circuit diagram of an active quenching circuit that may be implemented in the silicon photomultiplier of the photodetecting component of the present disclosure.

FIG. 1 shows an eye tracking device 10 according to the present disclosure. The eye tracking device 10 includes a laser light source 100 and a photodetecting component 200.

Such an eye tracking device 10 may be implemented in a virtual reality or augmented reality system. The eye tracking device 10 may for example be integrated into a virtual reality headset. These headsets have a display that is positioned in front of the eyes of the person wearing the headset. The display shows images of a virtual, computer-generated world. The images presented to the wearer are automatically adapted to the wearer's gaze and head position. This creates an immersive experience. The wearer has the true impression of being part of the computer rendered virtual reality.

The eye tracking device 10 of FIG. 1 may also be integrated into augmented reality glasses. In contrast to virtual reality headsets, augmented reality glasses do not recreate a completely virtual environment. Rather, they simply display information or images in the field of view of the wearer. The wearer can still see the real world through the glasses. The information and/or images displayed by the augmented reality glasses help the wearer in her perception of and interaction with the real world.

In this context, an eye tracking device, such as the one shown in FIG. 1, is used to determine and follow the direction of the wearer's gaze. By knowing in real time what the wearer is looking at, the displayed information and images can be improved.

The basic operation of the eye tracking device 10 of FIG. 1 is as follows:

The laser light source 100, for example, an infrared laser, emits light pulses L at a predetermined frequency. These light pulses may also be called photon bursts. The photon bursts L may have an approximate Gaussian profile, a peak irradiance in the range of 0.5 to 5 mW per square centimetre and a full width at half maximum duration of 100 ns. Preferably, the photon bursts are in the infrared range so that they do not interfere with the user's vision. A typical wavelength of the light bursts may be around 850 nm. The emission frequency of the light bursts L may vary. Preferably, the emission frequency is lower than 2 MHz.

Light bursts L emitted by the laser light source 100 are scanned across the eye E of the user. Each light burst L hitting the user's eye E is reflected off the eye E as a light burst L'. The reflected light bursts L' are detected by the photodetecting component 200. Based on the output of the photodetecting component 200, one can then recreate an image of the user's eye E. By analysing the obtained images, one can then deduce the eye position and gaze point.

One will note that the light signal received by the photodetecting component 200 is a superposition of the light bursts L' reflected off the user's eye E and the background light B, which is present in the surroundings of the eye tracking device 10.

The photodetecting optoelectronic component 200 of the present disclosure takes the form of a fully integrated and packaged discrete optoelectronic device having a number of electrical terminals. It is a discrete packaged sensor. Such sensors can be manufactured on an industrial scale and sold individually in large numbers. In other words, the photodetecting component 200 may be qualified as a microchip having a set of electronic circuits on one small piece of semiconductor material.

The architecture of the photodetecting component 200 of the present disclosure will now be described. In FIG. 1, the photodetecting component 200 is delimited by the dashed contour.

The photodetecting component 200 comprises a power source, 202, a silicon photomultiplier (SiPM) 204, a sensing resistor 206, a comparator circuit 208, a counting circuit 210, and a calibration circuit 212.

The power source 202 may be a DC/DC converter. The power source 202 is connected to a first one, 214, of the two terminals of the silicon photomultiplier 204. It provides the silicon photomultiplier 204 with the bias voltage that it needs for its operation. Accordingly, the power source 202 is a voltage source.

The second terminal 216 of the silicon photomultiplier 204 is electrically connected to the sensing resistor 206. The other end of the sensing resistor 206 is connected to ground. The function of the sensing resistor 206 is to convert the current signal delivered by the silicon photomultiplier 204 into a voltage signal at the input of the comparator circuit 208.

Accordingly, the first input section 218 of the comparator circuit 208 is electrically connected to the second terminal 216 of the silicon photomultiplier 204. The second input section 220 of the comparator circuit 208 is used to provide the comparator circuit 208 with a sensitivity threshold value Vth representing the intensity contribution of background light B to the received light signal.

The output section 222 of the comparator circuit 208 is electrically connected to the input of the counting circuit 210. The output section 224 of the counting circuit 210 corresponds to the output terminal of the photodetecting component 200.

The calibration circuit 212 receives the output signal of the comparator circuit 208 as an input. The calibration circuit 212 also has a calibration trigger input section 226 for receiving a calibration triggering signal.

In the embodiment shown in FIG. 1, the silicon photomultiplier 204 is an analog silicon photomultiplier. This means that each of its single photon avalanche diodes or SPADS 228 (also called Geiger-Mode avalanche photodiodes) is electrically connected in series to a quenching resistor 230.

Alternatively, the silicon photomultiplier 204 may be a digital silicon photomultiplier. This means that each single SPAD 228 is not passively quenched via a resistor 230, but rather actively quenched by a conditioning circuit 232 (see FIG. 2). Such a conditioning circuit 232 typically includes a comparator 234, a monostable 236 and a quenching driver 238.

Figure 3:
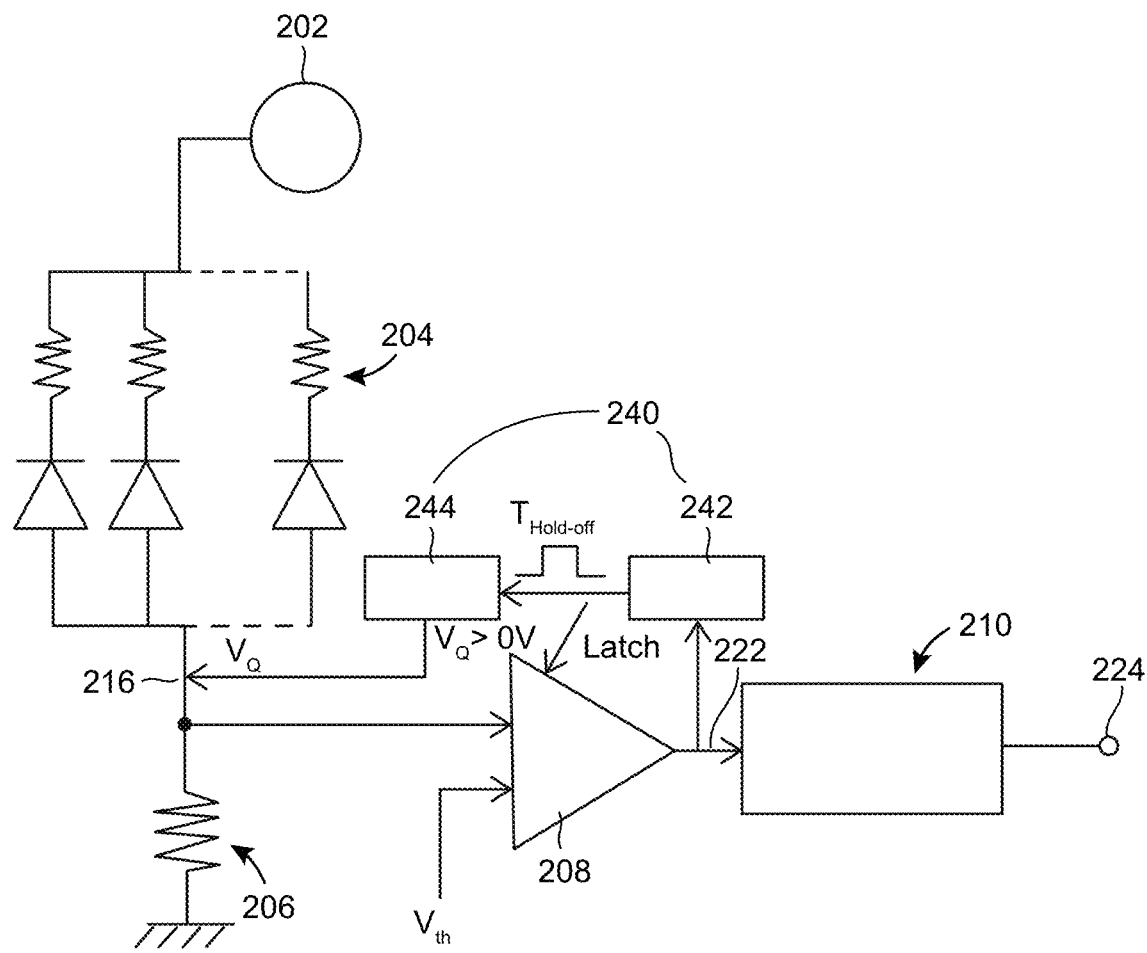
FIG. 3 illustrates the addition of an active quenching circuit for the entire silicon photomultiplier of the photodetecting component of the present disclosure.

In an alternative embodiment, as shown in FIG. 3, a single active quenching circuit 240 may be added to the photodetecting component 200. This single active quenching circuit 240 is electrically connected between the second terminal 216 of the silicon photomultiplier 204 and the output section 222 of the comparator circuit 208. It includes a monostable 242 and a quenching driver 244. The single active quenching circuit 240 lowers the voltage applied to the whole silicon photomultiplier 204 below the breakdown voltage for a fixed hold off time after detection of a light burst L. This allows to save power and to reduce spurious noise effects like after pulsing.

The operation of the photodetecting component 200 will now be described with reference to FIG. 4. FIGS. 4a to 4d show how an exemplary light signal incident on the photodetecting component 200 is processed by the different stages of the photodetecting component 200.

Figure 4A:
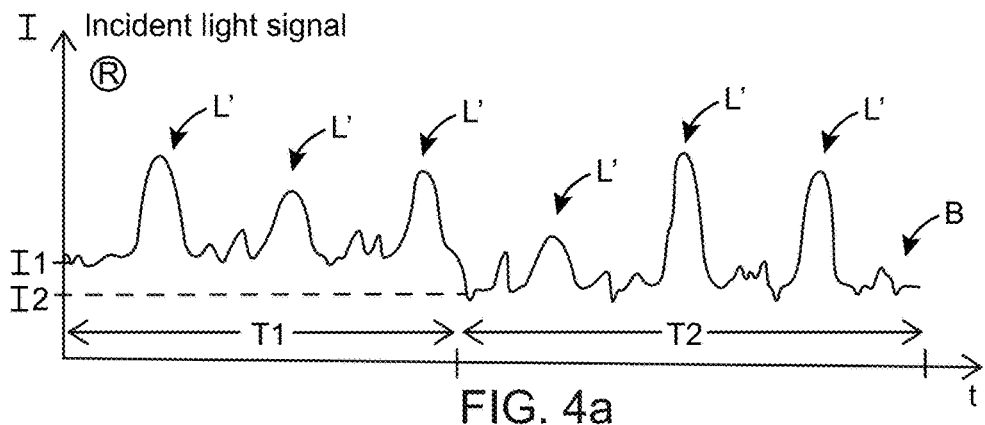
FIGS. 4A-4D are four graphs showing an incident light signal and the corresponding electrical outputs of the different elements of the photodetecting component of the present disclosure.

The incident light signal R shown in the graph in FIG. 4a is the kind of signal that the photodetecting component 200 is designed to detect and process. Such a signal R is a combination of light bursts L' and background light noise B. The background light noise B corresponds to the illumination level of the ambient background light surrounding the photodetecting component 200. The amount and exact shape of the background light B very much depends on the context in which the photodetecting component 200 is used. However, it can be assumed that the intensity I of the background light B will be more or less constant, at least over a sizeable amount of time. In the example shown in FIG. 4a, the intensity of the background light B has a first average intensity I1 over a first time period T1 and then a second lower average intensity I2 over a second time period T2. The light bursts L' are for example the reflections of laser light bursts L emitted by the laser light source 100 at a constant frequency.

Figure 4B:
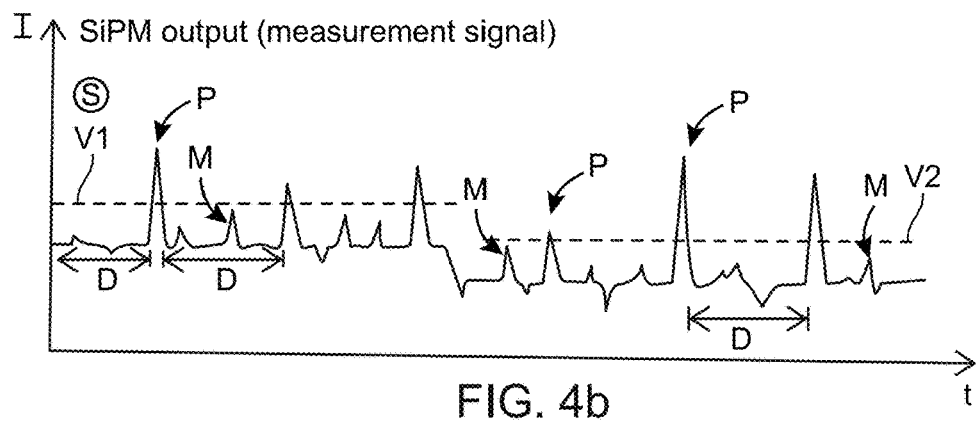

FIG. 4b shows the output of the silicon photomultiplier 204. The silicon photomultiplier 204 measures the intensity of light signal R shown in FIG. 4a. The corresponding output is a measurement signal S shown in FIG. 4b. As apparent from FIG. 4b, the measurement signal S includes several main spikes P, which correspond to the light bursts L' in the light signal R. Furthermore, the measurement signal S also includes several secondary spikes M, which stem from the background light B. These secondary spikes M are unwanted noise and should be suppressed by the photodetecting component 200.

Figure 4C:
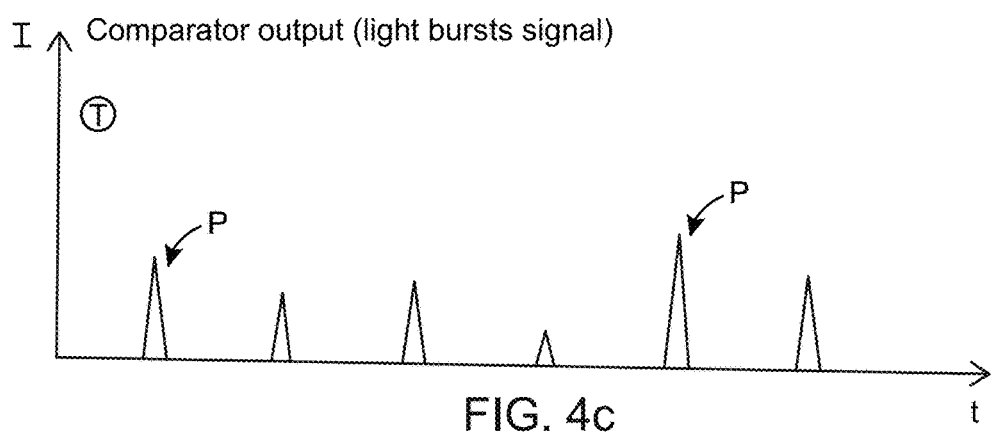
Figure 4D:
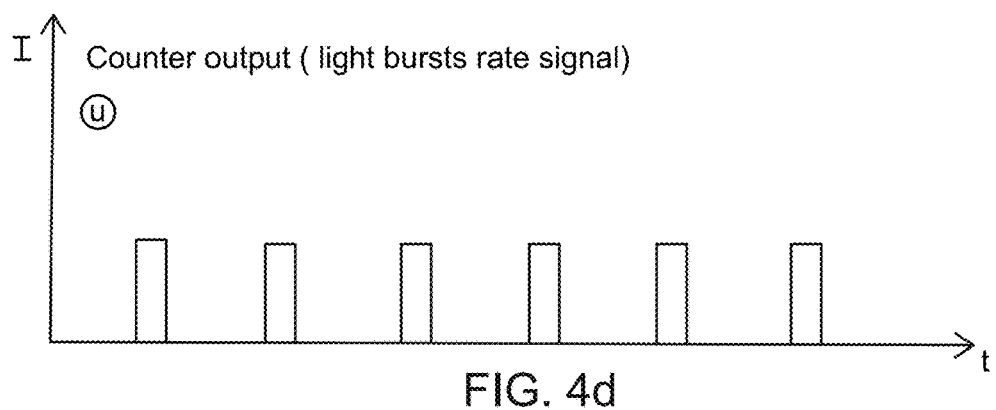

According to the present disclosure, the noise M is suppressed with the help of the comparator circuit 208. The comparator circuit 208 receives, at the second input section 220, a sensitivity threshold value Vth, which represents the intensity contribution of the background light B to the received light signal R. The comparator circuit 208 suppresses the measurement signal S during time intervals D where the measurement signal S is smaller or equal to the sensitivity threshold value Vth. The comparator circuit 208 then outputs the intermittently suppressed measurement signal as a light bursts signal T, which is indicative of the light bursts detected in the light signal R. An example of a light bursts signal T is shown in FIG. 4c. One will note that the light bursts signal T no longer contains any background noise. The only remaining elements are the main spikes P corresponding to the light bursts L'.

Light bursts signal T is then fed to the counting circuit 210. The counting circuit 210 transforms the light bursts signal T into a light bursts rate signal U shown in FIG. 4d.

In one embodiment, the counting circuit 210 may be replaced by an analogue-to-digital converter (ADC) for charge integration. In that case, the digital output of the ADC will provide information on the integrated charge in a fixed time frame proportional to the number of cells fired in the SiPM, proportional in turn to the impinging photon flux.

In one embodiment of the present disclosure, the photodetecting component 200 may also include a calibration circuit 212. The purpose of the calibration circuit 212 is to adjust the sensitivity threshold value Vth to variations in the intensity of the background light B. To that effect, the calibration circuit 212 operates as follows:

During time intervals where no light bursts L' are incident on the silicon photomultiplier 204, i.e. during time intervals with background illumination B only, the threshold value Vth at the second input section 220 of the comparator circuit 208 is set to a minimum calibration threshold value. This effectively inhibits the suppression of the ambient light noise B by the comparator 208. Accordingly, the output signal at the output section 222 of the comparator circuit 208 is a measure of the current intensity contribution of the background light B to the received light signal R. The calibration circuit 212 then determines the maximum value of the output signal obtained from the comparator circuit 208. This maximum value is then set as the new sensitivity threshold value Vth.

Thus, the photodetecting component 200 of the present disclosure is able, in this embodiment, to adapt its background noise rejection to the current ambient light conditions. This improves the sensitivity of the photodetecting component 200 compared to an embodiment using a fixed sensitivity threshold value Vth.

This process of adapting the sensitivity threshold value Vth is illustrated in FIG. 4b. In the first half of the curve S corresponding to the time interval T1, the ambient light noise is higher than in the second half, corresponding to the time interval T2. To compensate for this, the photodetecting component 200 lowers its sensitivity threshold value Vth from a first value V1 to a second value V2. The second value V2 is obtained via a recalibration carried out by the calibration circuit 212, right after the end of the time interval T1. Such a recalibration may be triggered by a calibration triggering signal received at the input section 226 of the calibration circuit 212.

Summarising, the photodetecting component of the present disclosure is characterised by:
- a high signal-to-noise ratio in a wide range of experimental conditions, even for very low impinging photon fluxes, owing to the very high sensitivity of the silicon photomultiplier down to single photon level, and, preferably, the implementation of a suitable calibration procedure to minimise the influence of the ambient light;
- an operation at high gain thanks to the intrinsic internal amplification of the silicon photomultiplier;
- a very fast timing response (less than 1 ns rise time);
- a straightforward and low cost implementation as an integrated circuit.

Even though the photodetecting component of the present disclosure has been described in the context of eye tracking, the photo detecting component may also be used in other applications that require the detection of short, high frequency and low intensity light bursts.

B. Semiconductor Photodiode with Improved Light Detection

The present disclosure pertains to a semiconductor photodiode, in particular an avalanche photodiode, comprising:
- a top side with an active surface area for light entry into the photodiode;
- a bottom side opposite to the top side;
- a bulk structure made of a single semiconductor material such as silicon, the bulk structure comprising a p-type layer and an n-type layer, which together form the p-n junction of the photodiode, wherein one of the two layers of the p-n junction is an upper p-n junction layer and the other one is a lower p-n junction layer, wherein the upper p-n junction layer is located proximate to the active surface area; and
- a semiconductor light absorption layer.

Figure 5:
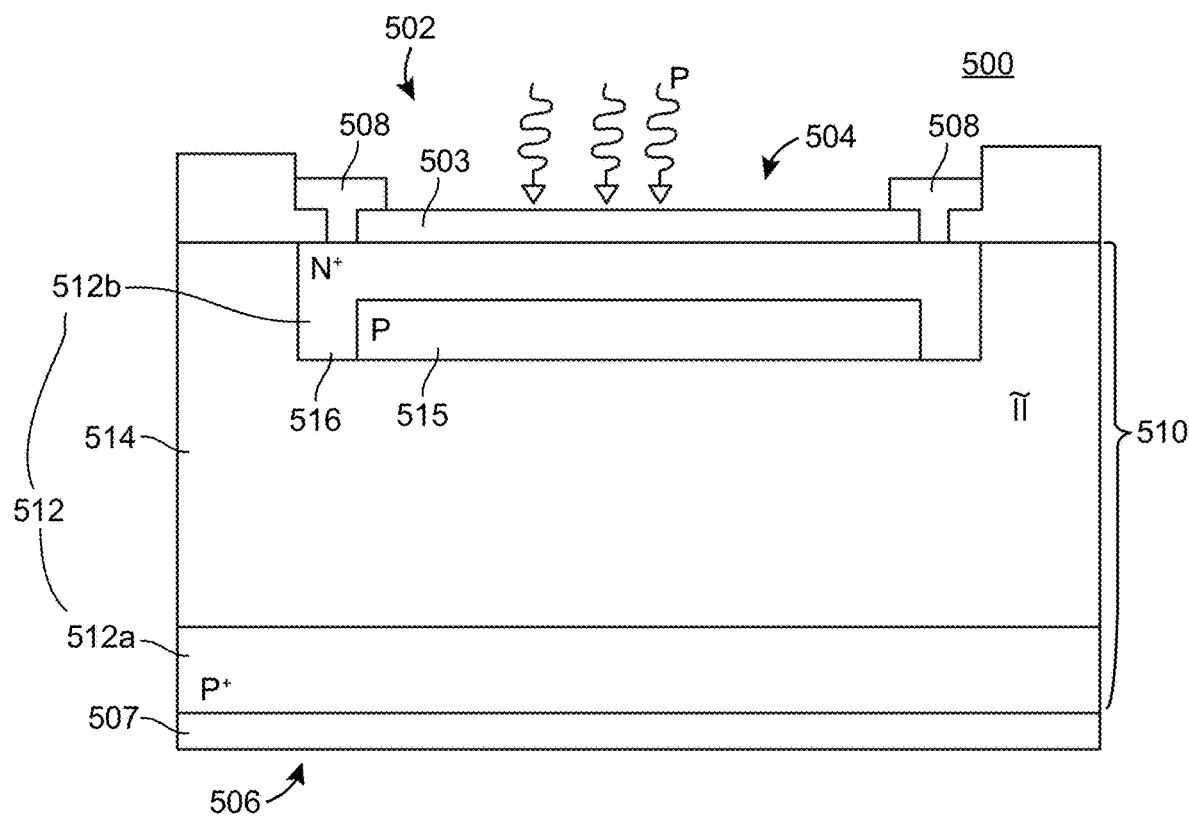
FIG. 5 is a stack diagram of a prior art PIN-structured avalanche photodiode.

Such a semiconductor photodiode is known. A typical example thereof is shown in FIG. 5. FIG. 5 illustrates the setup of a typical PIN-structured avalanche photodiode. The avalanche photodiode 500 has a top side 502 with an active surface area 504 for light entry into the photodiode. An anti-reflective coating 503 delimits the active surface area 504. The avalanche photodiode 500 also has a bottom side 506 opposite to the top side 502. A bulk structure 510 made of silicon includes a p-n junction 512 with a p+-type layer 512a at the bottom of the bulk structure 510, and an n+-type layer 512b at the top of the bulk structure 510. The p+-type layer 512a is in electrical contact with a lower metallic anode contact 507. The n+-type layer 512b is in electrical contact with an upper metallic cathode contact 508. An avalanche region in the bulk structure 510 is defined by a p-type layer 515 adjacent to and below the n+-type layer 512b. The avalanche region 515 is surrounded by a guard ring 516 protruding downwards from the n+-type layer 512b. An intrinsic silicon layer 514 is sandwiched in between the two layers 512a, 512b of the p-n junction 512.

The intrinsic layer 514 in the bulk structure 510 acts as a light absorption region where photons P, having entered the avalanche photodiode 500 via the active surface area 504, can be absorbed and thus detected by the photodiode. The photon detection efficiency of the avalanche photodiode 500 can be improved by increasing the thickness of the intrinsic silicon layer 514. However, a thicker intrinsic layer 514 increases the photodiode's breakdown voltage. Consequently, the avalanche photodiode 500 must be operated at a higher operating voltage, which increases its power consumption. Furthermore, even a thick intrinsic silicon layer 514 does not result in an acceptable photon detection efficiency in the near infrared (NIR) range of the light spectrum. This is because silicon is poor at absorbing photons in the near infrared range.

In the present application, the near infrared range is understood to correspond to a light wavelength of between around 750 nm and around 1400 nm.

A different known type of avalanche photodiode is based on an PNI structure instead of a PIN structure. In a PNI structure, a PN junction is arranged on top of a thick epitaxial neutral layer. This design has the advantage of a low breakdown voltage. However, PNI-structured photodiodes suffer from a slow timing response, in particular when it comes to the detection of light in the near infrared range. The photocarriers generated by the absorption of NIR photons in the neutral layer first need to diffuse to the lower edge of the PN junction before they can be accelerated to trigger avalanche events. This leads to so-called diffusion tails in the signal delivered by the avalanche photodiode and thus increases the photodiode's latency. In view of the above, it is thus an object of the present disclosure to provide a semiconductor photodiode, and in particular an avalanche photodiode, which has a good photon detection efficiency, in particular in the NIR range, and at the same time a low breakdown voltage and a good timing performance.

Preferably, the bulk structure of the provided semiconductor photodiode should be such that it can be manufactured using standard CMOS fabrication processes.

A more general goal is to provide a semiconductor photodiode that is suited for use in a wide range of consumer applications, for example as part of a time of flight sensor or of a LIDAR system, in domotics or robotics, or for vital signs monitoring.

According to the present disclosure, these objects are achieved with a semiconductor photodiode as defined above, which is characterised in that:
- the light absorption layer defines the active surface area;
- the light absorption layer is arranged on top of the bulk structure, above the upper p-n junction layer; and
- the semiconductor material of the light absorption layer is different from the semiconductor material of the bulk structure, the light absorption layer and the upper p-n junction layer thus forming a heterojunction.

By positioning the light absorption layer at the light inlet of the silicon photodiode, on top of the bulk structure, the light absorption region is no longer part of the bulk structure. Accordingly, the light absorption region can be made from a different material than the bulk material. This means that the design of the light absorption region can focus on optimising light absorption. The bulk structure can be designed independently of the light absorption layer, and thus be optimised to have a low breakdown voltage and a quick timing response.

According to preferred embodiments, the silicon photodiode of the present disclosure may have one, several or all of the below mentioned features, in all technically possible combinations:

the light absorption layer is a p-type layer;
the semiconductor material of the light absorption layer is highly absorbent in the near infrared;
the semiconductor material of the light absorption layer has a bandgap that is smaller than the bandgap of monocrystalline silicon;
the material of the light absorption layer is chosen from the group consisting of carbon nanotubes, silicon nanowires and black silicon;
a precursor layer, preferably made of a metal such as nickel or iron, arranged between the bulk structure and the light absorption layer, the light absorption layer being grown on the precursor layer;
a buffer layer between the precursor layer and the bulk structure, the buffer layer preferably being made of aluminium(III) oxide;
the precursor layer is patterned;
a protection layer on top of the light absorption layer for protecting the light absorption layer, the protection layer being preferably made of a semi-transparent metal such as Indium Tin Oxide;
two electrode contacts, wherein the protection layer provides an electrical contact between one of the electrode contacts and the light absorption layer;
the upper p-n junction layer is the p-type layer and the lower p-n junction layer is the n-type layer;
the p-n junction is a shallow junction.

The present disclosure also relates to a method of manufacturing the silicon photodiode as defined above.

Figure 6:
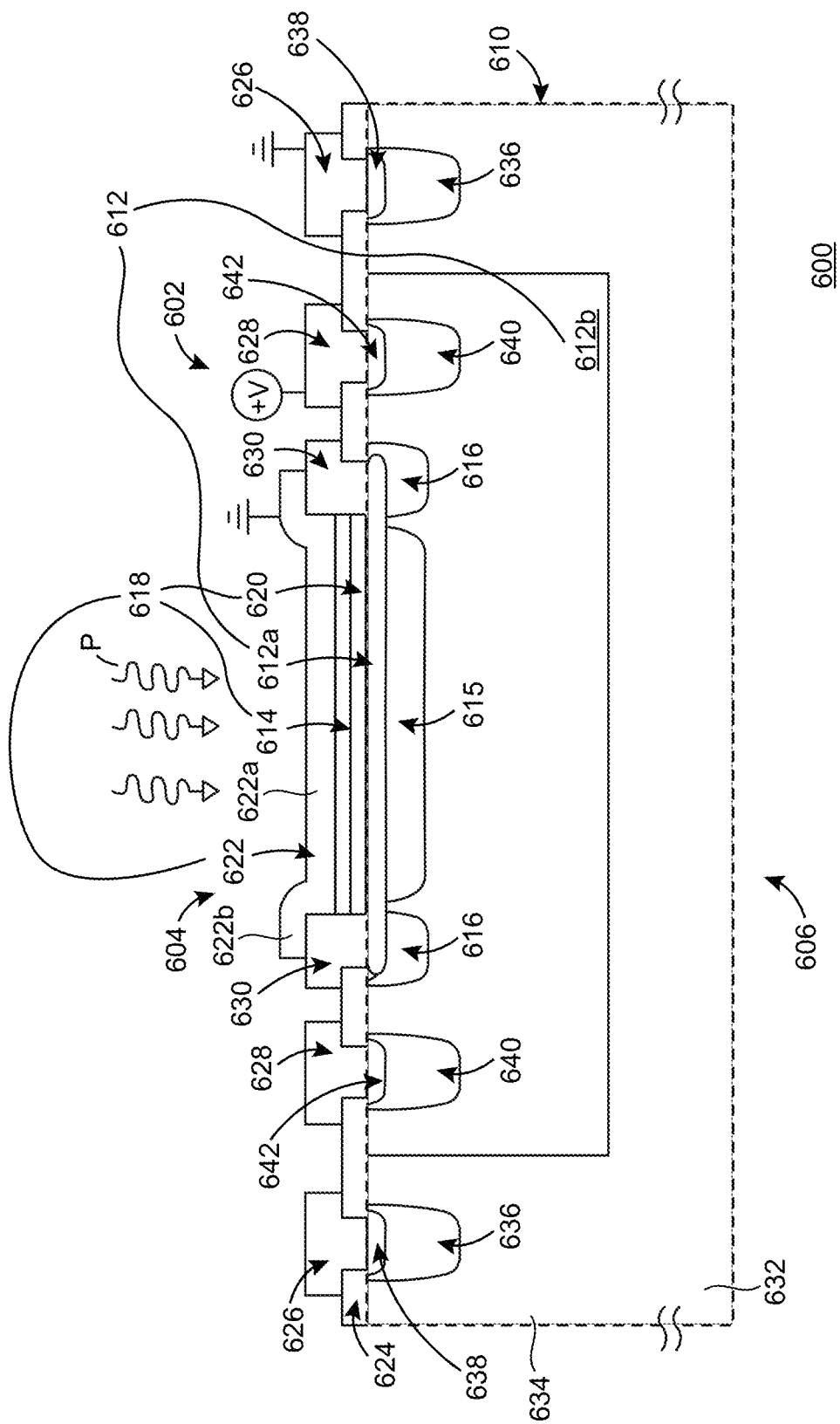
FIG. 6 is a stack diagram of a first embodiment of a silicon photodiode according to the present disclosure.
Figure 7:
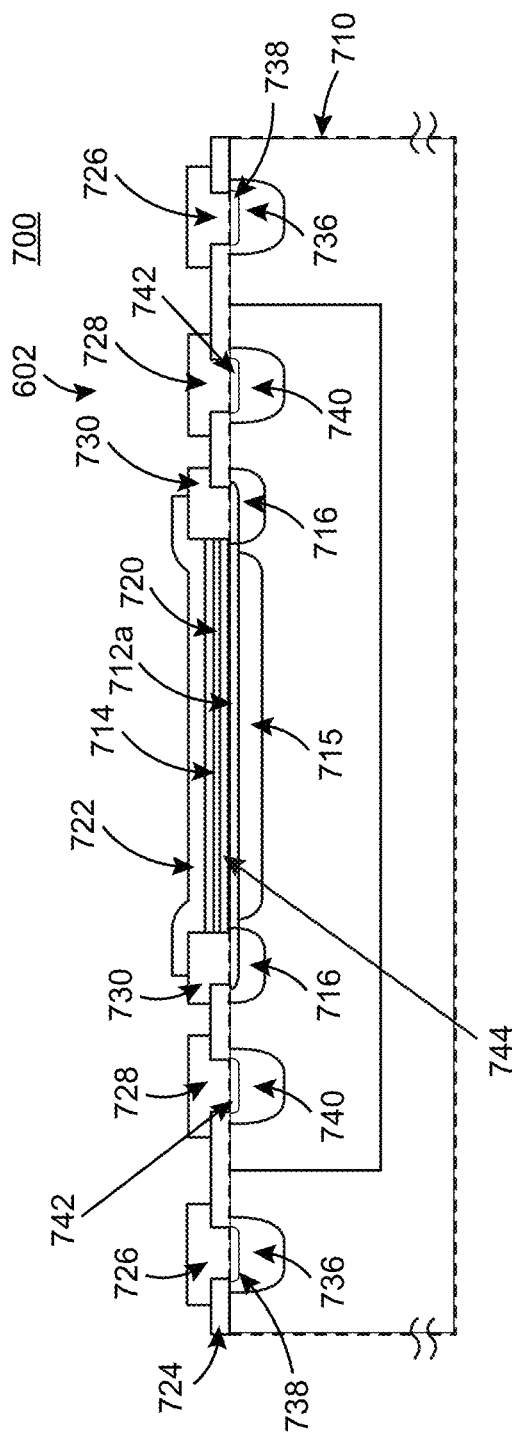
FIG. 7 is a stack diagram of a silicon photodiode according to a second embodiment of the present disclosure.
Figure 8:
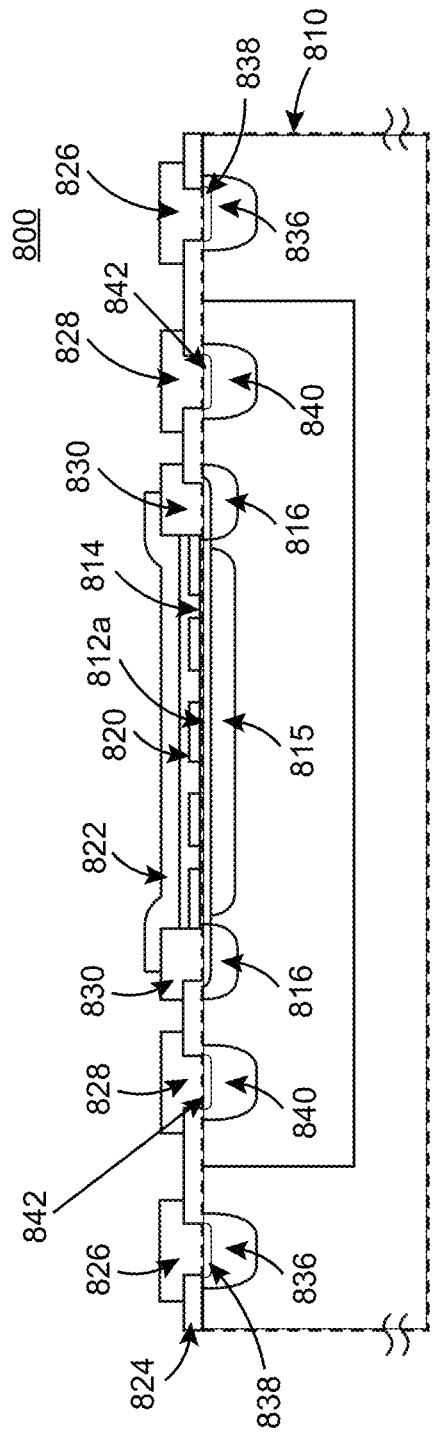
FIG. 8 is a stack diagram of a silicon photodiode according to a third embodiment of the present disclosure.

Different embodiments of the present disclosure will now be described in detail with reference to the figures, wherein:

FIG. 5 is a stack diagram of a prior art PIN-structured avalanche photodiode;

FIG. 6 is a stack diagram of a first embodiment of a silicon photodiode according to the present disclosure;

FIG. 7 is a stack diagram of a silicon photodiode according to a second embodiment of the present disclosure;

FIG. 8 is a stack diagram of a silicon photodiode according to a third embodiment of the present disclosure; and FIGS. 9 to 14 show the different process steps for depositing a precursor layer, a light absorption layer and a protection layer on a bulk structure to obtain the silicon photodiode according to FIG. 6.

FIG. 6 shows a silicon photodiode 600 according to a first embodiment of the present disclosure. The device 600 of FIG. 6 is an avalanche photodiode, which is optimised for the detection of light in the near infrared range. Such avalanche photodiodes are particularly suited for the detection of infrared radiation emitted from continuous or pulsed infrared light sources. These types of light sources are used in a relevant number of applications, e.g. as part of time-of-flight sensors, for eye tracking in augmented our virtual reality displays, or in functional near infrared spectroscopy. Such light sources typically emit light radiation at a wavelength of around 850 nm, 905 nm or 940 nm. The avalanche photodiode 600 shown in FIG. 6 is tailored to be particularly sensitive to light at such wavelengths.

The avalanche photodiode 600 of FIG. 6 comprises a top side 602 with an active surface area 604 for the entry of light into the photodiode 600, a bottom side 606 opposite to the topside 602, a bulk structure 610 made of silicon, and a light inlet stack 618 sitting on top of the bulk structure 610. semiconductor light absorption layer 614.

The active surface area 604 is that part of the top surface of the photodiode 600 through which incident light P can enter the photodiode 600 and be detected.

The light inlet stack 618 comprises, from top to bottom, a protection layer 622, a light absorption layer 614, and a precursor layer 620.

An electrically insulating layer 624 is arranged on top of the bulk structure 610 and surrounds the active surface area 604.

The insulating layer or field oxide 624 may be made of silicon dioxide. Its thickness may be around 0.4 μm.

Additionally, a highly doped p-type polycrystalline semiconductor (e.g. with a doping of $10^{20}$ atoms per cubic centimetre and a thickness of 0.2 μm) may be deposited on the insulating layer 624 (not shown in the Figures). This additional layer should surround the active surface area 604 as an additional measure to reduce the electrical field at the edge of the PN junction (field plate solution).

Three electrode contacts 626, 628 and 630 traverse the insulating layer 624 and make electrical contact with the bulk structure 610. The three electrode contacts 626, 628 and 630 are concentrically arranged around the centre of the photodiode 600. There is an outer electrode contact 626, a middle electrode contact 628 and an inner electrode contact 630. The outer electrode contact 626 is a substrate contact. In operation, this substrate contact 626 can be set to ground or left floating.

The middle electrode contact 628 is a cathode contact. It corresponds to the cathode of the photodiode 600. In operation, the cathode contact 628 may be positively biased at a voltage +V. The operating voltage +V may be below the breakdown voltage of the photodiode 600, if the photodiode 600 operates as a standard avalanche photodiode. If the photodiode 600 is to be operated as a single photon avalanche diode or SPAD, the operating voltage +V at the cathode contact 628 must be higher than the photodiode's breakdown voltage. The inner electrode contact 630 is an anode contact. It corresponds to the anode of the photodiode 600. In operation, the anode contact 630 is set to ground.

The electrical contacts 626, 600 and 28, 630 may be deposited using standard photo lithographic and etching processes.

The bulk structure 610 is delimited by a dashed rectangle. It is made of a single semiconductor material, which in the present case, is silicon. It comprises a heavily doped p-type layer 612a, i.e. a p+-type layer, and an n-type layer 612b, which together form the PN junction 612 of the photodiode 600. In the present embodiment, the p+-type layer 612a is the upper layer of the PN junction 612 and the n-type layer 612b is the lower layer of the PN junction 612. However, the PN junction may of course also be inverted.

The upper PN junction layer 612a is located proximate to the active surface area 604.

Besides the PN junction 612, the bulk structure 610 also includes a substrate 632. The substrate 632 is made of lightly positively doped silicon, i.e. is of the p_-type. The substrate 632 is trough-shaped, and has an outer rim 634. The rim 634 surrounds the entire n-type layer 612b of the PN junction 612.

The n-type layer 612b may also be called a deep N well. In order to minimise the breakdown voltage of the photodiode 600, the PN junction 612 is a so-called shallow junction. This means that the thickness of the PN junction is small compared to the overall thickness of the bulk structure 610. For example, the thickness of the PN junction may be around 1% of the thickness of the bulk structure 610. The p+-type layer 612a of the junction 612 is implemented as a thin layer, which is embedded in the deep N well 612b. The thickness of the p+-type layer 612a may for example be around 5% of the thickness of the deep N well 612b.

The bulk structure 610 of the photodiode 600 also includes elements to prevent edge breakdown. In the example of FIG. 6, these edge breakdown preventing elements are an n+-type enrichment layer 615 and a p--type guard ring 616. The guard ring 616 runs along the circumference of the p+-type layer 612a of the PN junction 612. The guard ring 616 is embedded in the deep N well 612b. The n+-type enrichment layer 615 is located below the p+-type layer 612a of the PN junction 612. The n+-type enrichment layer 615 is in direct surface contact with the p+-type layer 612a. The n+-type enrichment layer 615 is embedded in the deep N well 612b. It will be noted that the edge breakdown preventing elements 616 and 615 are optional. One or both of them may be omitted.

The interface between the substrate contact 626 and the substrate rim 634 is provided with a P well 636. A p+-type enrichment region 638 may be embedded in the P well 636. Likewise, the interface between the cathode contact 628 and the deep N well 612b is provided with an N well 640. An n+-type enrichment layer 642 may embedded in the N well 640.

The main idea of the present disclosure is the provision of the light absorption layer 614 on top of the bulk structure 610, above the upper PN junction layer 612a. The light absorption layer 614 is made of a semiconductor material, which is highly absorbent in the wavelength range to be detected by the photodiode 600. This dedicated material is different from the semiconductor material (in the present example, silicon) of the bulk structure 610. Hence, the light absorption layer 614 and the upper PN junction layer 612a together form a heterojunction.

The light absorption layer 614 is located on the top and at the centre of the photodiode 600. It defines the active surface area 604.

In the example shown in FIG. 6, the light absorption layer 614 is sandwiched between the protection layer 622 and the precursor layer 620.

Preferably, the light absorption layer 614 is a p-type layer.

Preferably, the light absorption layer 614 consists of carbon nanotubes. Carbon nanotubes (CNT) layers have a high light absorption in the near infrared. The light absorption layer 614 may alternatively also be made of silicon nanowires or black silicon.

The precursor layer 620 is only optional, but may be helpful for facilitating the growth of the light absorption layer 614 on the bulk structure 610. The protection layer 622 on top of the light absorption layer 614 is also optional.

The optional precursor layer 620 may be arranged between the bulk structure 610 and the light absorption layer 614. Typically, the light absorption layer 614 will be grown on the precursor layer 620. The precursor layer 620 may for example be made of a metal such as nickel or iron.

The protection layer 622 on top of the light absorption layer 614 may be made of a semi-transparent or fully transparent metal such as indium tin oxide. In the embodiment shown in FIG. 6, the metal protection layer 622 ensures that the light absorption layer 614 and the anode contact 630 are at the same electrical potential. This is achieved in that a central part 622a of the protection layer 622 makes electrical contact with the light absorption layer 614, and a peripheral part 622b of the protection layer 622 makes electrical contact with the anode contact 630. To this end, the peripheral part 622b is in direct physical contact with the anode contact 630, and the central part 622a is in direct physical contact with the light absorption layer 614.

The operation of the avalanche photodiode 600 is as follows: Light P, which is to be detected, enters the photodiode 600 via the active surface area 604. It is then absorbed by the light absorption layer 614. This generates minority carriers (in this case electrons), which drift towards the positively/reverse biased n-type side 612b of the PN junction 612. The accelerated electrons trigger avalanche events at the interface between the p+-type layer 612a and the n+-type enrichment region 615.

FIG. 7 shows a second embodiment 700 of an avalanche photodiode according to the present disclosure. The avalanche photodiode 700 is identical to the avalanche photodiode 600 except for the additional presence of a buffer layer 744 located between the precursor layer 720 and the bulk structure 710. The buffer layer 744 is preferably made of aluminium (III) oxide. The purpose of the buffer layer 744 is to guarantee a good adhesion of the overlying precursor and light absorption layers 720, 714 to the bulk structure 710. The buffer layer 744 can also prevent the diffusion of silicon from the bulk structure 710 into the precursor layer 720 during the fabrication of the avalanche photodiode 700. Preferably, the buffer layer 744 has a small thickness in the nanometre range to facilitate the tunnelling of the minority carriers generated in the light absorption layer 714 through the buffer layer 744. The thickness of the buffer layer 744 may be less than 50 nm. Buffer layer 744 may be deposited on the surface of the bulk structure 710 by atomic layer deposition (ALD).

FIG. 8 shows a third embodiment 800 of an avalanche photodiode according to the present disclosure. The avalanche photodiode 800 is identical to the avalanche photodiode 600 of the first embodiment, except that the precursor layer 820 is patterned. This is achieved with a suitable additional photomask process during the fabrication of the avalanche photodiode 800. The patterning of the precursor layer 820 improves the adhesion of the light absorption layer 814 to the bulk structure 810. The patterning of the precursor layer 820 can also be combined with a buffer layer, such as shown in FIG. 7.

A process of manufacturing the avalanche photodiode 600 according to FIG. 6 will now be detailed.

The bulk structure 610 is the first part to be fabricated. This is done using standard implantation or doped layers deposition processes, followed by dedicated low-temperature processes for the drive in and activation of the impurities in the silicon. Boron and phosphor dopants may be used to create the p-type or n-type wells and layers, respectively. The bulk structure may be tailored to have a breakdown voltage of around 20 V with standard CMOS processing.

Typical values for the parameters of the different layers of the bulk structure 610 are reported in the table below:

| Layer | Doping/Thickness |
| --- | --- |
| P⁻ Substrate | $5 \times 10^{14}$ cm$^{-3}$/300 µm |
| Deep N Well | $1 \times 10^{16}$ cm$^{-3}$/4 µm |
| P Well/N Well | $6 \times 10^{16}$ cm$^{-3}$/1 µm |
| P⁺/N⁺ Enrichment Contacts | $4 \times 10^{19}$ cm$^{-3}$/0.2 µm |
| N⁺ Enrichment Layer | $2 \times 10^{17}$ cm$^{-3}$/0.8 µm |
| P⁻ Ring | $2 \times 10^{17}$ cm$^{-3}$/1.2 µm |
| P⁺ Anode | $4 \times 10^{19}$ cm$^{-3}$/0.2 µm |

FIGS. 9 to 14 only show the part of the manufacturing process which relates to the deposition of the light inlet stack 618, i.e. to the deposition of the precursor layer 620, the light absorption layer 614 and the protection layer 622.

Figure 9:
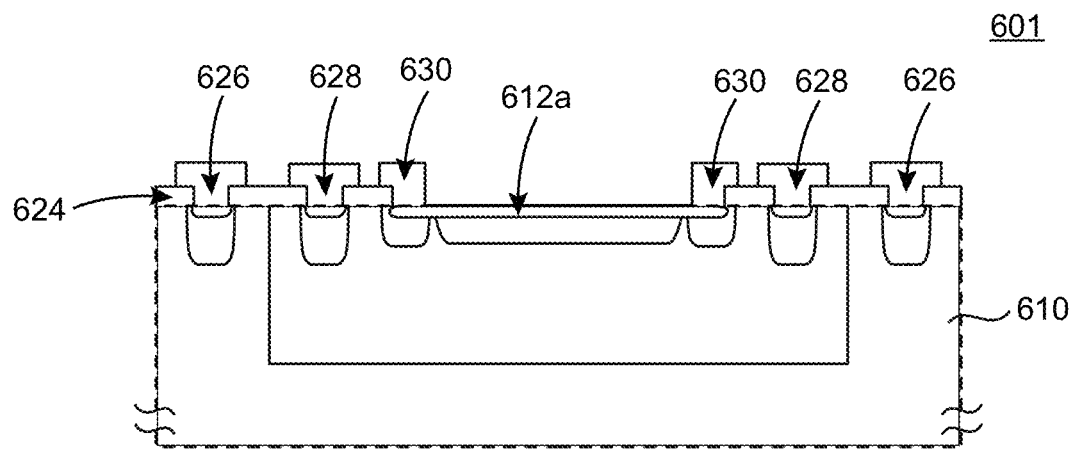
FIGS. 9 to 14 show the different process steps for depositing a precursor layer, a light absorption layer and a protection layer on a bulk structure to obtain the silicon photodiode according to FIG. 6.

FIG. 9 thus shows the unfinished avalanche photodiode prior to the deposition of the precursor layer 620. The semi-manufactured device 601 shown in FIG. 9 comprises the finished bulk structure 610 and on top thereof, the insulating layer 624, as well as the outer substrate contact 626, the middle cathode contact 628 and the inner anode contact 630.

The process according to the present disclosure might also start from an intermediate product, which is different from the intermediate product 601 shown in FIG. 9 in that the upper layer of the PN junction is covered by one or more insulating or metal layers. In such a case, said insulating or metal layers first need to be removed locally to uncover the upper PN junction layer. This is to allow the light inlet stack 618 to be deposited directly onto the upper PN junction layer.

It is to be noted here that the light inlet stack 618 can be deposited onto various different types of photodiode bulk structures. The present disclosure is not limited to the bulk structure shown in the Figures.

Figure 10:
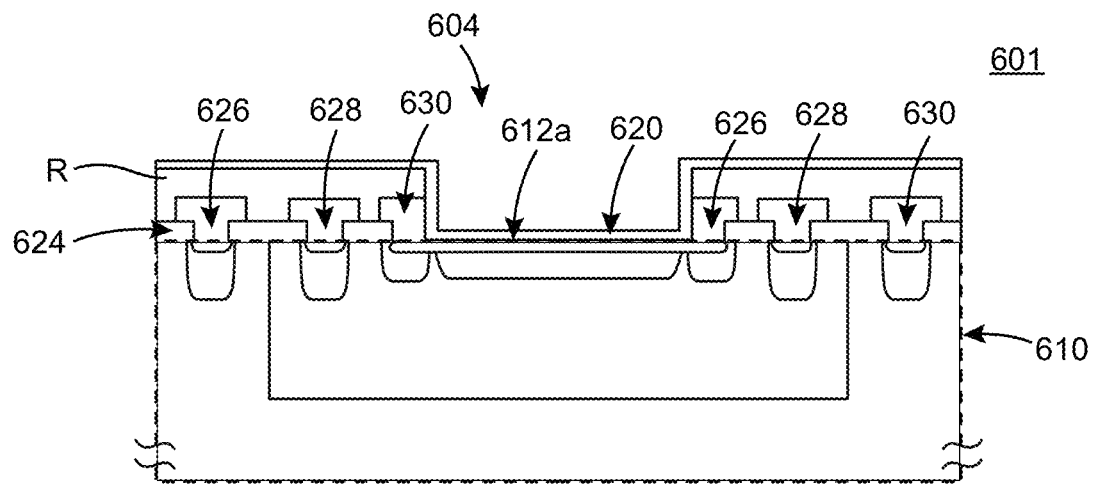
Figure 11:
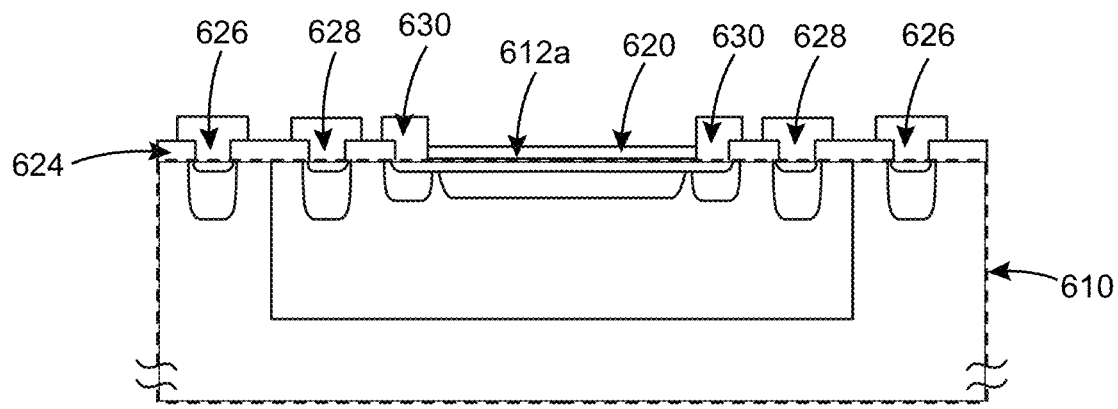
Figure 12:
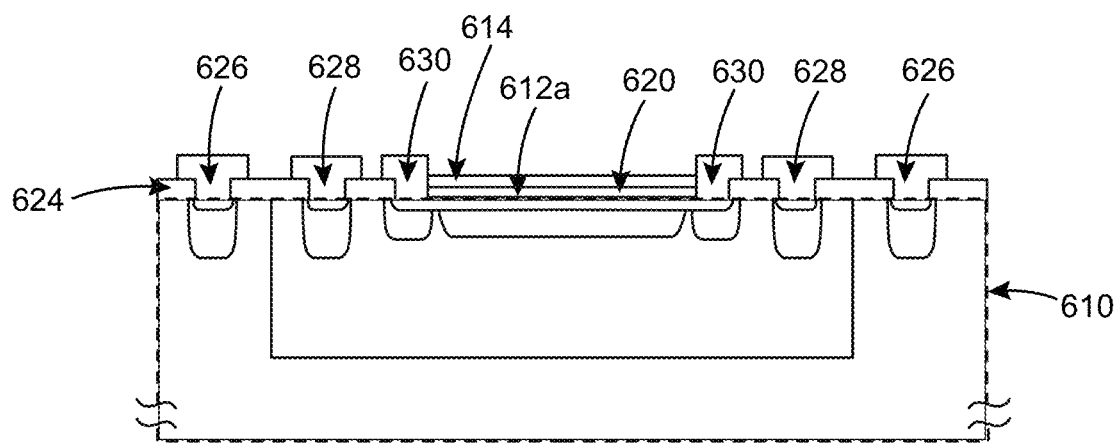

We will now focus on the deposition of the precursor layer 620, with reference to FIGS. 9 to 11. Starting from FIG. 9, a photoresist layer R is deposited on top of the semi-finished device 601. The photoresist present in the active surface area 604 is removed using a photomask process. After that, the precursor material 620 is deposited over the entire top of the unfinished device 601. The result is shown in FIG. 10. The precursor material may be, for example, Nickel or Iron. In the case of Nickel, the deposition thickness may be of the order of nm. In the case of Iron, the deposition thickness may be of the order of 3 nm. The deposition may be done via electron beam evaporation.

This is followed by a lift-off process for the selective removal of the photoresist and the overlying precursor layer outside the active surface area 604. The result is shown in FIG. 11. The finished precursor layer 620 sits on top of the p-type layer 612a of the PN junction.

The next step is to grow the light absorption layer 614 over the precursor layer 620. For example, carbon nanotubes may be grown on the precursor layer 620 by chemical vapour deposition for 10 minutes at 750° C. Alternatively, the carbon nanotubes may be grown on the precursor layer 620 via a plasma enhanced chemical vapour deposition for around 10 minutes at around 450° C. The finished carbon nanotubes layer 614 may have an overall thickness of the order of 50 μm.

Figure 13:
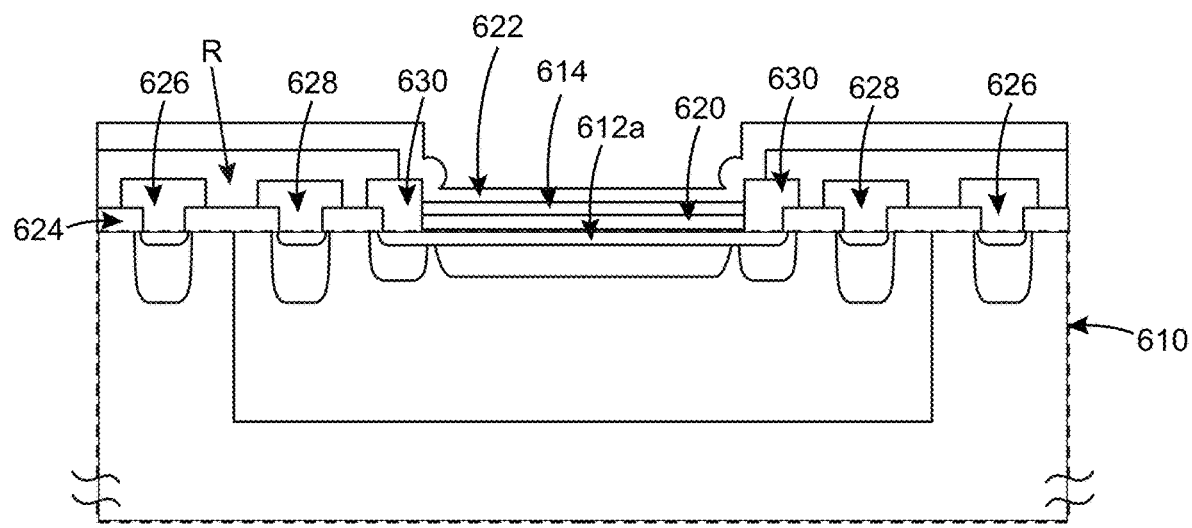
Figure 14:
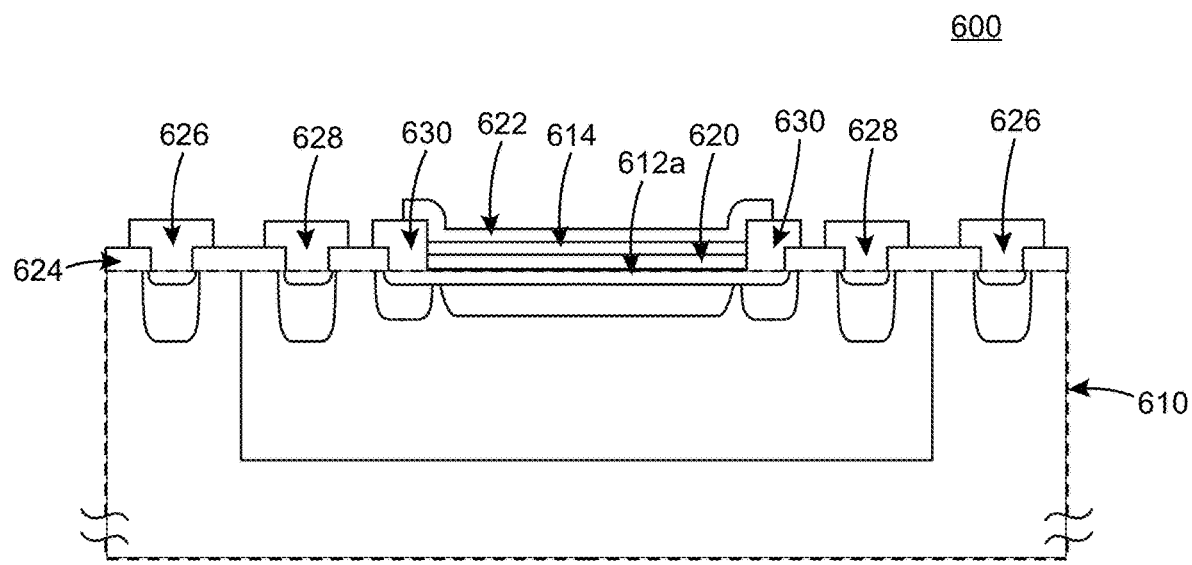

In the last phase of the process, shown in FIGS. 13 and 14, the light absorption layer 614 is protected via a thin semi-transparent metal layer 622.

The protection layer 622 is deposited in the same way as the precursor layer 620, i.e. via a photolithographic and lift-off process. The material used for the protection layer 622 may be indium tin oxide. The thickness of the finished protection layer 622 may be of the order of 100 nm.

The process ends with the finished avalanche photodiode 600 shown in FIG. 14.

Summarising, the present disclosure teaches an innovative type of semiconductor photodiode structure, which has a high photon detection efficiency in the whole sensitivity range, and more particularly in the infrared region, a low breakdown voltage and a good timing performance.

Furthermore, the proposed dedicated light absorption layer 614 and the corresponding light inlet stack 618 are compatible with a large set of bulk photodiode structures, including those fabricated using CMOS processing. The deposition of the light absorption layer 614, and possibly of the precursor layer 620 and the protection layer 622, involves a series of low-temperature process steps that can be performed after metallisation without affecting the doping and thickness of the PN junction and more generally of the defined doped layers in the bulk structure.

The light absorption layer 614 can have its absorption efficiency tailored to the specific wavelength ranges that need to be detected in a particular application.

More generally, the proposed solution allows to remarkably improve the detection efficiency of semiconductor photodiodes, which can be used with limited power consumption in a wide range of consumer applications.

Also mentioned in the introductory part of the description that the disclosure not only covers the product, but also the corresponding manufacturing process.

The invention claimed is:

1. An integrated photodetecting optoelectronic semiconductor component for detecting light bursts in a light signal received by the component, the component comprising:
 a silicon photomultiplier for:
  measuring the intensity of the light signal received by the component, and
  outputting a measurement signal that is indicative of the light intensity of the received light signal;
 a comparator circuit comprising a first input section, a second input section and an output section,
 wherein the comparator circuit is operatively connected to the silicon photomultiplier via its first input section; and
 wherein the comparator circuit is adapted to:
  receive, via its first input section, the measurement signal outputted by the silicon photomultiplier,
  receive, via its second input section, a sensitivity threshold value representing the intensity contribution of background light to the received light signal,
  suppress the measurement signal during time intervals where the measurement signal is smaller or equal to the sensitivity threshold value, and
  output, as a light bursts signal indicative of the light bursts detected in the light signal, the suppressed measurement signal;
 wherein each single photon avalanche diode of the silicon photomultiplier is quenched.

2. The photodetecting component according to claim 1, further comprising a calibration circuit for adjusting a sensitivity of the photodetecting component to current background light conditions, wherein the calibration circuit is configured to adapt the sensitivity threshold value at the second input section of the comparator circuit as a function of the intensity of the background light present in the received light signal.

3. The photodetecting component according to claim 2, wherein the calibration circuit has a calibration trigger input section for receiving a calibration triggering signal, and wherein the calibration circuit is adapted to:
 a) receive, via its input section, a calibration triggering signal;
 b) upon receipt of a calibration triggering signal, set the value at the second input section of the comparator circuit to a minimum calibration threshold value;
 c) obtain an output signal at the output section of the comparator circuit; and
 d) set a maximum value of the obtained output signal as the new sensitivity threshold value.

4. The photodetecting component according to claim 1, further comprising a counting circuit for:

receiving, as an input, the light bursts signal outputted by the comparator circuit, counting a number of light bursts in the received light bursts signal, and outputting a light bursts rate signal indicative of the number of light bursts per unit time in the light signal received by the photodetecting component.

5. The photodetecting component according to claim 1, wherein each single photon avalanche diode of the silicon photomultiplier is passively quenched.

6. The photodetecting component according to claim 5, further comprising an active quenching circuit coupled to the silicon photomultiplier.

7. The photodetecting component according to claim 1, wherein each single photon avalanche diode of the silicon photomultiplier is actively quenched.

8. The photodetecting component according to claim 1, further comprising a power supply for the silicon photomultiplier.

9. The photodetecting component according to claim 8, wherein the power supply comprises a DC-DC converter.

10. The photodetecting component according to claim 1, wherein the silicon photomultiplier is an infrared silicon photomultiplier.

11. An eye tracking device comprising the photodetecting component according to claim 1.

12. An integrated photodetecting optoelectronic semiconductor component for detecting light bursts in a light signal received by the component, the component comprising:
    a silicon photomultiplier for:
        measuring the intensity of the light signal received by the component, and
        outputting a measurement signal that is indicative of the light intensity of the received light signal;
    a comparator circuit comprising a first input section, a second input section and an output section,
    wherein the comparator circuit is operatively connected to the silicon photomultiplier via its first input section; and
    wherein the comparator circuit is adapted to:
        receive, via its first input section, the measurement signal outputted by the silicon photomultiplier,
        receive, via its second input section, a sensitivity threshold value representing the intensity contribution of background light to the received light signal,
        suppress the measurement signal during time intervals where the measurement signal is smaller or equal to the sensitivity threshold value, and
        output, as a light bursts signal indicative of the light bursts detected in the light signal, the suppressed measurement signal;
    wherein the silicon photomultiplier is an infrared silicon photomultiplier.

13. An eye tracking device comprising an integrated photodetecting optoelectronic semiconductor component for detecting light bursts in a light signal received by the component, the component comprising:
    a silicon photomultiplier for:
        measuring the intensity of the light signal received by the component, and
        outputting a measurement signal that is indicative of the light intensity of the received light signal;
    a comparator circuit comprising a first input section, a second input section and an output section,
    wherein the comparator circuit is operatively connected to the silicon photomultiplier via its first input section; and
    wherein the comparator circuit is adapted to:
        receive, via its first input section, the measurement signal outputted by the silicon photomultiplier,
        receive, via its second input section, a sensitivity threshold value representing the intensity contribution of background light to the received light signal,
        suppress the measurement signal during time intervals where the measurement signal is smaller or equal to the sensitivity threshold value, and
    output, as a light bursts signal indicative of the light bursts detected in the light signal, the suppressed measurement signal.

* * * * *